US009929536B1

(12) United States Patent
Lin et al.

(10) Patent No.: US 9,929,536 B1
(45) Date of Patent: Mar. 27, 2018

(54) STRUCTURE OF VCSEL AND METHOD FOR MANUFACTURING THE SAME

(71) Applicant: TrueLight Corporation, Hsinchu (TW)

(72) Inventors: Bing-Cheng Lin, Hsinchu (TW); Chih Cheng Chen, Hsinchu (TW); Hung-Wei Tseng, Hsinchu (TW)

(73) Assignee: TrueLight Corporation (TW)

( * ) Notice: Subject to any disclaimer, the term of this patent is extended or adjusted under 35 U.S.C. 154(b) by 0 days.

(21) Appl. No.: 15/624,489

(22) Filed: Jun. 15, 2017

(51) Int. Cl.
*H01S 5/183* (2006.01)
*H01S 5/187* (2006.01)
*H01S 5/22* (2006.01)
*H01S 5/042* (2006.01)

(52) U.S. Cl.
CPC ........ *H01S 5/18344* (2013.01); *H01S 5/0421* (2013.01); *H01S 5/187* (2013.01); *H01S 5/18361* (2013.01); *H01S 5/22* (2013.01); *H01S 2304/04* (2013.01)

(58) Field of Classification Search
CPC .......... H01S 5/22; H01S 5/187; H01S 5/0421; H01S 5/18361
See application file for complete search history.

(56) References Cited

U.S. PATENT DOCUMENTS

| 8,971,367 B2* | 3/2015 | Uchida | H01S 5/18391 |
| | | | 372/43.01 |
| 2008/0205465 A1* | 8/2008 | Nguyen | H01S 5/18352 |
| | | | 372/45.01 |
| 2011/0274130 A1* | 11/2011 | Abeles | B82Y 20/00 |
| | | | 372/45.01 |

\* cited by examiner

*Primary Examiner* — Tuan Nguyen

(57) ABSTRACT

A vertical-cavity surface-emitting Laser (VCSEL) has a three-trench structure. By forming a first trench within a mesa around the periphery of an output window of the VCSEL, the overall capacitance is decreased and the time used in the oxidation process for an oxidation layer is shortened. By forming a second trench and a third trench on the periphery of the mesa in a step-like concave manner, the mesa becomes a step-like structure having double mesa-layers. Such that, a larger heat-radiating area can be obtained for decreasing thermal effects, while the metal-gap defects of the metal layer can also be avoided. The implant layer is formed around the periphery of the output window for controlling the optical mode and confining the current path. In addition, an output layer is formed on the output window for controlling the output light.

10 Claims, 9 Drawing Sheets

STRUCTURE OF VCSEL AND METHOD FOR MANUFACTURING THE SAME

This application claims the benefit of Taiwan Patent Application Serial No. 106104272, filed on Feb. 9, 2017, the subject matter of which is incorporated herein by reference.

BACKGROUND OF INVENTION

1. Field of the Invention

The invention relates to a structure of VCSEL and a method for manufacturing the same, and more particularly to the VCSEL structure and the method for manufacturing the VCSEL structure that introduce a three-trench structure to reduce overall capacitance and shorten time for oxidation process.

2. Description of the Prior Art

The VCSEL (Vertical Cavity Surface Emitting Laser) is one of emitting laser diodes. Since the VCSEL needs smaller power and is less expensive, the features of higher speeds and lower cost have made the VCSEL popular in local networking. Light-emitting and light-detecting materials for producing the VCSEL include mainly GaAs and InP. Generally, the metal-organic chemical vapor deposition (MOCVD) is adopted to produce the epitaxial wafer for the VCSELs. In comparison with a typical edge-emitting laser, the resonant chamber and mirrors for reciprocally exciting photos in the resonant chamber of the VCSEL are not the crystal lattice boundaries naturally formed during the manufacturing process, but already formed during the growth of the epitaxy of the epitaxial wafer for the VCSELs.

Generally, a typical VCSEL structure largely includes a light-emitting active layer, a resonant chamber and two distributed Bragg reflectors (DBR) with high reflectivity. When photos are generated in the light-emitting active layer, they would oscillate reciprocally inside the resonant chamber. As soon as any photo reaches the population inversion, a corresponding laser light would be formed on a surface of the VCSEL. Since the VCSEL adopts a surface-emitting laser, the induced laser light would be shaped into a cone, which is easier to couple with an optical fiber, without additional optical lens. For basic structuring, manufacturing and operating of the conventional VCSEL structure, please refer to U.S. Pat. No. 4,949,350 and U.S. Pat. No. 5,468,656.

This invention is provided to improve the aforesaid conventional VCSEL structure. By introducing a specific three-trench structure, the overall capacitance and to shorten the time for oxidation process can be reduced. Also, an ion-implanted layer at a periphery of an output window is used to control the optical modes and to confine the current path. Further, the output window is formed on a power output layer to control the output light. In addition, a step-like structure having double mesa-layers is furnished to conduct the heat and thereby to reduce thermal effects.

SUMMARY OF THE INVENTION

Accordingly, it is the primary object of the present invention to provide a structure of VCSEL and a method for manufacturing the same, that can utilize a specific three-trench structure for reducing the overall capacitance and shortening the time for oxidation process, and further form a step-like structure having double mesa-layers to reduce the thermal effects.

It is another object of the present invention to provide a structure of VCSEL and a method for manufacturing the same, that can use an ion-implanted layer at a periphery of an output window to control the optical mode and to confine the current path. In addition, a power output layer is formed on the output window for controlling the output light, in which the power output layer is made of a dielectric material with a reflective index ranging 1.5~2.0; for example, $SiO_2$, SiN or a mixture of the aforesaid two.

In the present invention, the VCSEL structure includes a substrate, a first mirror layer on the substrate, an active region on the first mirror layer, a second mirror layer on active region, an oxide layer in the second mirror layer, a mesa, a first isolation trench, a second isolation trench, a third isolation trench, a dielectric material, a first contact layer, and a second contact layer.

The mesa on the substrate is structured by at least a portion of the first mirror layer, the active region, the second mirror layer and the oxide layer. The output window is included in a central area of a top surface of the mesa. The first isolation trench in the mesa circles at least a portion of a periphery of the output window, and penetrates downward through the second mirror layer, the oxide layer and the active region from the top surface of the mesa. The second isolation trench circles at least another portion of the periphery of the mesa, is spaced from the first isolation trench by a gap, penetrates downward at least through the second mirror layer and the oxide layer, and has a bottom portion thereof located either in the active region or at the first mirror layer. The third isolation trench circles at least a further portion of the periphery of the mesa, is concave from the bottom portion of the second isolation trench, penetrates downward at least through the first mirror layer, and has a bottom portion thereof to be located at the substrate. The dielectric material at least fills the first isolation trench, the first contact layer is located on the top surface of the mesa by contacting the second mirror layer. The second contact layer is at least located on the bottom portion of the third isolation trench by contacting at least the substrate.

In one embodiment of the present invention, the VCSEL structure further includes an isolating layer covering at least a portion of an outer surface of the mesa, and at least a portion of the first contact layer and the second contact layer are exposed out of the isolating layer; the first mirror layer is an n-type distributed Bragg reflector (DBR) layer, while the second mirror layer is a p-type DBR layer; materials of the first mirror layer and the second mirror layer include AlGaAs with various Al mole percentages, wherein the oxide layer of the second mirror layer contains Al with a relative high mole percentage; the oxide layer at least extends horizontally from an inner rim of the first isolation trench toward a center of the mesa; the dielectric material is a polymer material with low dielectric properties; and, the first contact layer and the second contact layer are both metal layers.

In one embodiment of the present invention, the VCSEL structure further includes an ion-implanted region located in the second mirror layer by being close in height to or overlapping the oxide layer. The ion-implanted region inside the mesa is located between the output window and the first isolation trench by circling at least a portion of a periphery of the output window. Also, the first contact layer contacts an upper surface of the second mirror layer.

In one embodiment of the present invention, the VCSEL structure further includes a power output layer located on the output window on the top surface of the mesa.

In one embodiment of the present invention, the second contact layer is extended upward to an upper surface of the second mirror layer along respective oblique surfaces of the third isolation trench and the second isolation trench from the bottom portion of the third isolation trench, such that a top surface of the second contact layer is largely flush with the first contact layer, and a plane is formed at the bottom portion of the second isolation trench so as to have the second contact layer to be in a horizon-extending state at the bottom portion of the second isolation trench.

In another aspect of the present invention, the method for manufacturing a VCSEL structure, includes the steps of:

performing a semiconductor process on a laser-chip base material so as to have the laser-chip base material to include, in an upward order, a substrate, a first mirror layer on the substrate, an active region on the first mirror layer, and a second mirror layer on the active region;

performing a first mask manufacturing process through a first mask to form a first mask layer with a first predetermined pattern on and an upper surface of the second mirror layer, wherein the first predetermined pattern is respective to a pattern of the first mask;

performing an ion-implanting process to form an ion-implanted region in an area of the second mirror layer uncovered by the first photoresist layer, wherein a bottom portion of the ion-implanted region is spaced from the active region by a predetermined height;

with the first mask layer unremoved, performing a second mask manufacturing process through a second mask to form a second mask layer with a second predetermined pattern on the upper surface of the second mirror layer and the first mask layer, wherein the second predetermined pattern is respective to a pattern of the second mask;

performing a first etching process to form a first isolation trench by etching an area of the second mirror layer, the active region and the first mirror layer covered by the second mask layer, wherein the first isolation trench penetrates downward through the second mirror layer and the active region from the upper surface of the second mirror layer so as to have a bottom portion of the first isolation trench located at the first mirror layer;

performing an oxidating process through the first isolation trench to form an oxide layer extending horizontally in the second mirror layer, wherein the oxide layer is close in height to or overlapping the bottom portion of the ion-implanted region;

performing a second etching process to form a second isolation trench on the second mirror layer, wherein the second isolation trench penetrates downward at least through the second mirror layer and the oxide layer from the upper surface of the second mirror layer so as to locate a bottom portion of the second isolation trench in the active region or at the first mirror layer; and, performing a metal coating process to form a contact pad in a predetermined area on the upper surface of the second mirror layer;

performing a third etching process to form a concave third isolation trench at the bottom portion of the second isolation trench, wherein the third isolation trench penetrates downward at least through the first mirror layer so as to locate a bottom portion of the third isolation trench at the substrate; and filling a dielectric material into the first isolation trench, and forming an isolating layer, a first contact layer and a second contact layer respectively in specific areas on the laser-chip base material;

wherein a mesa is defined on the laser-chip base material by the second isolation trench and the third isolation trench, each of the second isolation trench and the third isolation trench circles at least a corresponding portion of a periphery of the mesa, the mesa on the substrate consists of at least a portion of the first mirror layer, the active region, the second mirror layer and the oxide layer, an output window is formed in a central area on a top surface of the mesa, the first isolation trench located in the mesa circles at least a portion of a periphery of the output window and is spaced from the second isolation trench by a gap, and the first isolation trench penetrates downward at least through the second mirror layer, the oxide layer and the active region from the top surface of the mesa;

wherein the first contact layer located on the top surface of the mesa contacts the second mirror layer, the second contact layer at least located at the bottom portion of the third isolation trench at least contacts the substrate, the second contact layer is extended upward to the upper surface of the second mirror layer along respective oblique surfaces of the third isolation trench and the second isolation trench from the bottom portion of the third isolation trench such that a top surface of the second contact layer is largely flush with the first contact layer, and a portion of the first contact layer and the second contact layer is at least exposed out of the isolating layer.

All these objects are achieved by the structure of VCSEL and the method for manufacturing the same described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a structure of VCSEL and a method for manufacturing the same. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

The structure of VCSEL and the method for manufacturing the same in accordance with the present invention mainly applies a specific three-trench structure to reduce the overall capacitance and to shorten the time for oxidation process, such that a step-like structure having double mesa-layers can be formed to reduce the thermal effects In addition, an ion-implanted layer at a periphery of an output window is used to control the optical modes and to confine the current path, and also the output window is formed on a power output layer to control the output light.

Figure 1:
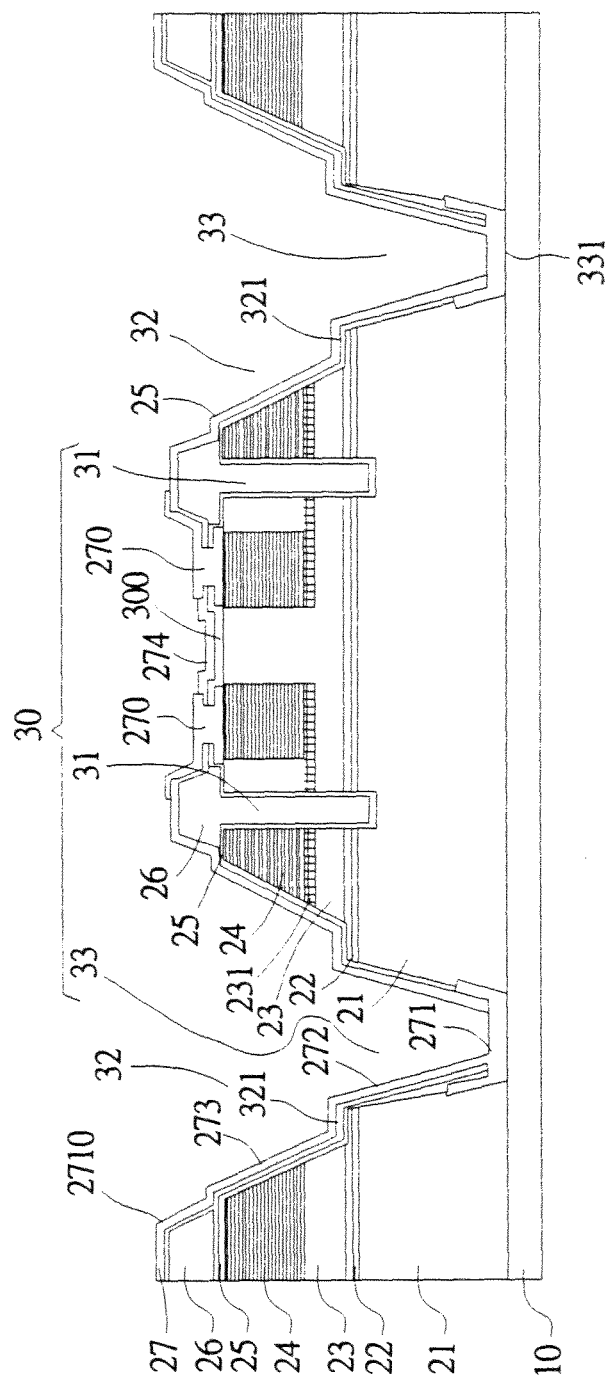
FIG. 1 is a schematic cross-sectional view of a preferred embodiment of the VCSEL structure in accordance with the present invention.

Referring now to FIG. 1, a schematic cross-sectional view of a preferred embodiment of the VCSEL stricture in accordance with the present invention is shown.

In this embodiment, the VCSEL structure is constructed on a laser-chip base material mainly made of a GaAs or InP material. The base material includes, in an upward order, a substrate 10, a first mirror layer 21 located on the substrate 10, an active region 22 located on the first mirror layer 21, and a second mirror layer 23 located on the active region 22. Within the second mirror layer 23, an oxide layer 231 is located. In this embodiment, the first mirror layer 21 is an n-type distributed Bragg reflector (DBR) layer, or called as a lower mirror. On the other hand, the second mirror layer 23 is a p-type DBR layer, or called as an upper mirror layer. Both the first mirror layer 21 and the second mirror layer 23 contain multi-layer structures made of AlGaAs with various Al mole percentages. In particular, the oxide layer 231 of the second mirror layer 23 contains Al with a relative high mole percentage. Thereupon, while in the oxidation process, the oxide layer 231 can form an insulation $Al_2O_3$ layer.

In the VCSEL structure of the present invention, the base material further includes a mesa 30, a first isolation trench 31, a second isolation trench 32, a third isolation trench 33, a dielectric material 26, a first contact layer 270, a second contact layer 271~273, an ion-implanted region 24, an isolating layer 25 and a power output layer 274.

The mesa 30 located on the substrate 10 is made up of at least a portion of the first mirror layer 21, the active region 22, the second mirror layer 23 and the oxide layer 231. An output window 300 is formed at a central area of a top surface of the mesa 30. In this embodiment, the oxide layer 231 is high enough to be close to a bottom portion of the ion-implanted region 24, and even part thereof is overlapping a bottom portion of the ion-implanted region 24.

The first isolation trench 31 is located in the mesa 30, and circles at least a portion of the periphery of the output window 300. The first isolation trench 31 extends downward from the top surface of the mesa 30, and penetrates at least the second mirror layer 23, the oxide layer 231 and the active region 22, such that the bottom portion of the first isolation trench 31 can reach the first mirror layer 21.

The second isolation trench 32 circles at least a portion of the periphery of the upper part of the mesa 30, and is spaced from the first isolation trench 31 by a gap. The second isolation trench 32 extends downward to penetrate at least the second mirror layer 23 and the oxide layer 231, such that a bottom portion 321 of the second isolation trench 32 can be located at one of the active region 22 and the first mirror layer 21. The oxide layer 231 extends horizontally from an inner rim of the first isolation trench 31 toward the center of the mesa 30.

The third isolation trench 33 circles at least a portion of the periphery of the lower part of the mesa 30, and is concave down from the bottom portion 321 of the second isolation trench 32. Also, the third isolation trench 33 penetrates downward at least the first mirror layer 21 (or penetrates the active region 22 and the first mirror layer 21), such that a bottom portion 331 of the third isolation trench 33 can be located at the upper surface of the substrate 10.

In this embodiment, the dielectric material 26, preferable a polymer material with low dielectric properties, is to fill at least the first isolation trench 31 so as to reduce the overall capacitance of the VCSEL structure. In this embodiment, the dielectric material 26 is a polymer, for example a polymide, with a reflective index of 1.5~1.6. In this present invention, the resort of digging out the first isolation trench 31 and then filling with a polymer (dielectric material 26) can reduce substantially the area of the semiconductor material that is featured in a high dielectric index, and thereby the corresponding capacitance can be reduced. The first contact layer 270 and the second contact layer 271~273 is part of the metal layer 27. The first contact layer 270 is located on the top surface of the mesa 30, and contacts an upper surface 240 of the second mirror layer 23. The second contact layer 271, 272, 273 is at least located at the bottom portion 331 of the third isolation trench 33, and at least contacts the substrate 10. In this embodiment, the second contact layer 271, 272, 273 is extended upward to the upper surface 240 of the second mirror layer 23 along respective oblique surfaces of the third isolation trench 33 and the second isolation trench 32 from the bottom portion 331 of the third isolation trench 33, such that a top surface 2710 of the second contact layer 271, 272, 273 can be largely flush with the top surface of the first contact layer 270. Hence, in the present invention, the first contact layer 270 and the second contact layer 271, 272, 273 are both located one the same surface of the substrate 10, and also reach substantially the same height, from which the following wire bonding could be much easier. In addition, a plane is formed at the bottom portion 321 of the second isolation trench 32, and thus the second contact layer 271, 272, 273 can be in a horizon-extending state at the bottom portion 321 of the second isolation trench 32. Thereupon, a step-like structure having double mesa-layers an thus be formed to provide a broader lower mesa for enlarging the heat-radiating area and thereby for better reducing the thermal effects. Also, the two-stage concave second and third isolation trenches 32, 33 contribute to reduce the slopes of the corresponding oblique surfaces, and further the bottom portion 321 of the second isolation trench 32 is formed as a plane, such that, while the second contact layer 271, 272, 273 is under plating, sputtering or evaporating for forming the metal layer, possible metal-gap defects can be effectively prevented.

The ion-implanted region 24 in the second mirror layer 23 is located above the active layer 22. In this embodiment, part of the bottom portion of the ion-implanted region 24 is overlapped with the oxide layer 231. By varying corresponding aperture size of the oxide layer 231 and the ion-implanted region 24, the optical mode can thus be controlled. In the present invention, the ion implantation is gain-guided, but the oxidation is index-guided. The control of the optical mode can be achieved by the hybrid application of the ion implantation process and the oxidation process. Further, the ion-implanted region 24 in the mesa 30 is located between the output window 300 and the first isolation trench 31 by circling at least a portion of the periphery of the output window 300. Also, the first contact layer 270 contacts an upper surface of the ion-implanted region 24. In the present invention, additional ion-implanted layer 24 located at the periphery of the output window 300 can be used to control the optical mode and to confine the current path. In this embodiment, the ion-implanting process can implant protons or oxygen ion at a depth of 2~4 um.

The isolating layer 25 is to cover at least a portion of an outer surface of the mesa 30, and at least a portion of the first contact layer 270 and the second contact layer 271, 272, 273 are exposed out of the isolating layer 25. The power output layer 274, located on the output window 300 of the top surface of the mesa 30, is to control the output light, according to the refractive index, thickness and optical wavelength of the power output layer 274. In the present invention, the material for the power output layer 274 can be $Si_3N_4$, $SiO_2$, $Si_3O_4$, SiN, SiNO or the like. In particular, in this embodiment, the power output layer 274 can be made of a dielectric material; for example, $SiO_2$, SiN or a mixture of the aforesaid two with a reflective index of 1.5~2.0.

Referring now to FIG. 2A to FIG. 7, different stages in order of a preferred embodiment of the method for manufacturing VCSEL structure are schematically shown.

Figure 2A:
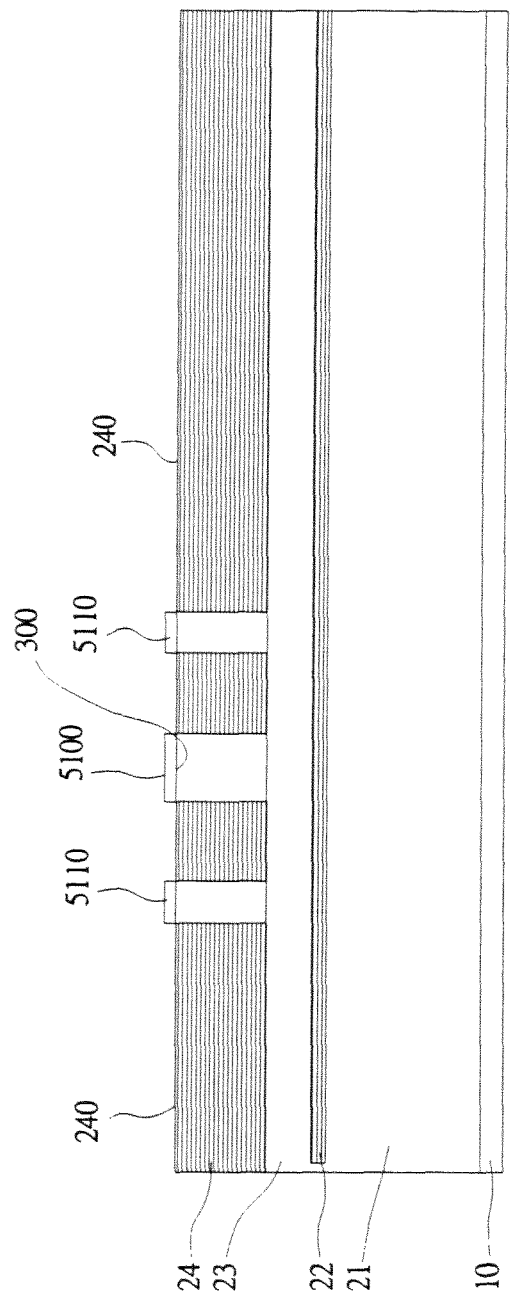
FIG. 2A is a schematic view of a first stage of a preferred method for manufacturing the VCSEL structure in accordance with the present invention.
Figure 2B:
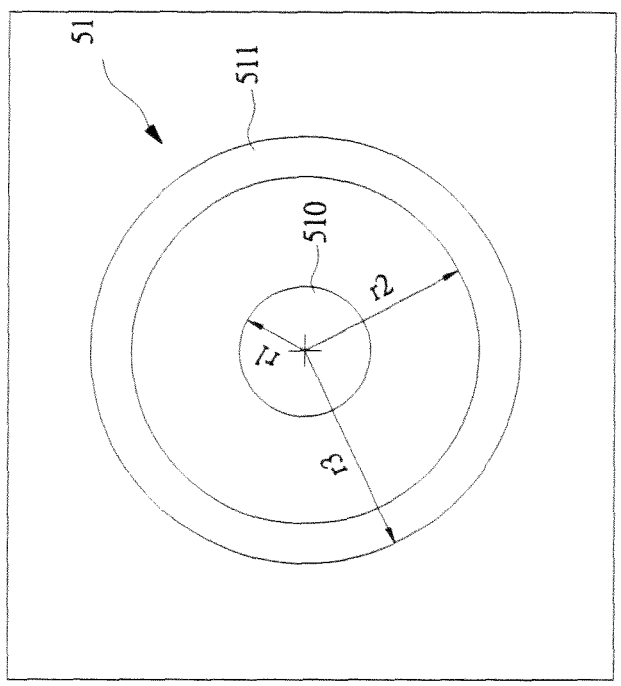
FIG. 2B is a schematic view of an embodiment of the pattern for the first mask in accordance with the present invention.

As shown in FIG. 2A, a schematic view of a first stage of the preferred method for manufacturing the VCSEL structure in accordance with the present invention is schematically illustrated. In the method for manufacturing VCSEL structure of the present invention, a laser-chip base material is consisted of, in an upward order, a substrate 10, a first mirror layer 21 located on the substrate 10, an active region 22 located on the first mirror layer 21, and a second mirror layer 23 located on the active region 22. Then, a first mask manufacturing process is performed on a first mask so as to form a first mask layer having a first predetermined pattern on an upper surface 240 of the second mirror layer 23, in which the first predetermined pattern is respective to the pattern 51 of the first mask. As shown in FIG. 2B, a schematic view of an embodiment of the pattern 51 for the first mask in accordance with the present invention is illustrated. The pattern 51 of the first mask includes a central circle area 510 and a ring area 511 circling the periphery of the central circle area 510, in which a radius of the central circle area 510 is r1, an inner radius of the ring area 511 is r2, an an outer radius of the ring area 511 is r3. The central circle area 510 of the first mask pattern 51 is defined at the area on the upper surface 240 of the second mirror layer 23 respective to the output window 300 where is covered by the mask 5100, and the ring area 511 of the first mask pattern 51 is defined at the area on the upper surface 240 of the second mirror layer 23 where is covered by the mask 5110 but not implanted by ions. The first mask layer includes the masks 5100, 5110. Then, as shown in FIG. 2A, an ion-implanting process is performed on the area of the second mirror layer 23 uncovered by the first mask layer (mask 5100, 5110) so as to undergo ion-implantation process for forming an ion-implanted region 24, where a bottom portion of the ion-implanted region 24 is spaced from the active region 22 by a predetermined height. In this embodiment, a bottom portion of the effective ion-implanted area is partly overlapped with the oxide layer. By providing the additional ion-implanted layer 24 at the periphery of the output window 300 according to the present invention, the optical mode can be controlled and the current path can be confined.

Figure 3A:
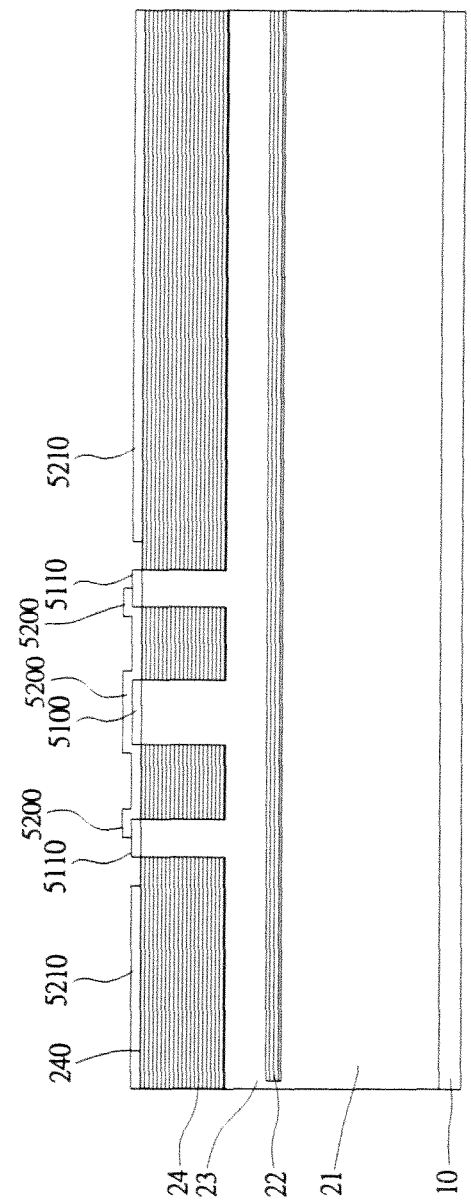
FIG. 3A is a schematic view of a second stage of the preferred method for manufacturing the VCSEL structure in accordance with the present invention.
Figure 3B:
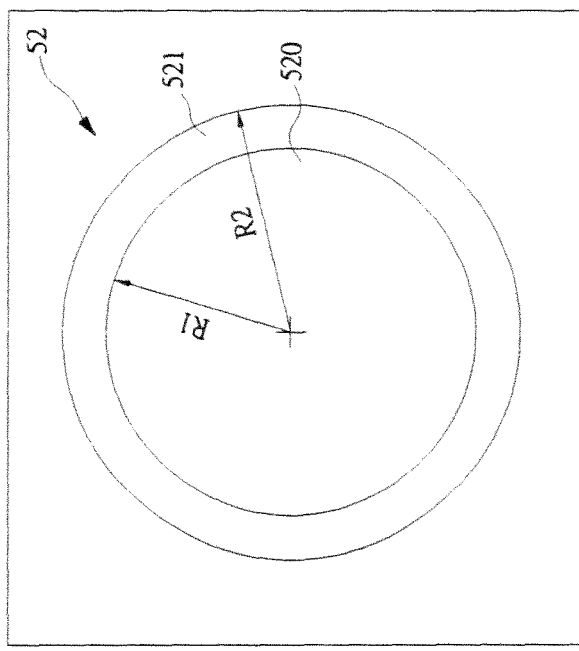
FIG. 3B is a schematic view of an embodiment of the pattern for the second mask in accordance with the present invention.

As shown in FIG. 3A, a schematic view of a second stage of the preferred method for manufacturing the VCSEL structure in accordance with the present invention is schematically illustrated. Under the circumstances that the first mask layers 5100, 5110 are yet to be removed, a second mask is applied to perform a second mask manufacturing process. A second mask layer having a second predetermined pattern is formed on the upper surface 240 of the second mirror layer 23 and the first mask layers 5100, 5110, in which the second predetermined pattern is located respective to the pattern 52 of the second mask. As shown in FIG. 3B, a schematic view of an embodiment of the pattern 52 for the second mask in accordance with the present invention is illustrated. The pattern 52 of the second mask includes a central circle area 520 and a periphery area 521 circling the central circle area, in which a radius of the central circle area 520 is R1, and an inner radius of the periphery area 521 is R2. The central circle area 520 and the periphery area 521 of the second mask pattern 52 are defined respective to the area on the upper surface 240 of the second mirror layer 23 that is covered by the masks 5200, 5210. The area uncovered by the masks 5200, 5210 is then etched to generate the first isolation trench 31. In this embodiment, the second mask layer includes the masks 5200, 5210.

In this embodiment, the radius R1 of the central circle area 520 of the second mask pattern 52 is ranged between the inner radius r2 of the ring area 51 of the first mask pattern 51 and the radius r3 of the periphery (i.e., r2<R1<r3). Also, the inner radius R2 of the the periphery area 521 of the second mask pattern 52 is larger than the radius r3 of the periphery of the ring area 511 of the first mask pattern 51 (i.e., r3<R2). Hence, while in performing the first and the second mask processes, self-alignment can be achieved so as to increase alignment precision of the aperture of the oxide layer 231 and the ion-implanted region 24 in the following manufacturing processes.

Figure 4:
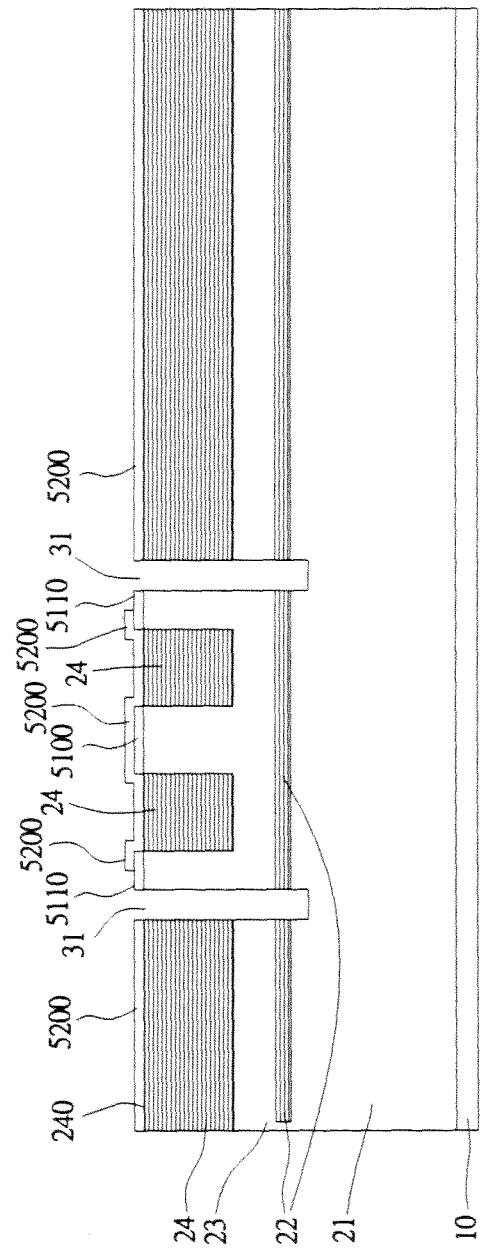
FIG. 4 is a schematic view of a third stage of the preferred method for manufacturing the VCSEL structure in accordance with the present invention.

Then, as shown in FIG. 4, a schematic view of a third stage of the preferred method for manufacturing the VCSEL structure in accordance with the present invention is schematically illustrated. A first etching process is performed at the second mirror layer 23 to etch the uncovered areas by the second mask layers 5200, 5210 at the active region 22 and the first mirror layer 21, such that a first isolation trench 31, is formed. As shown, the first isolation trench 31 penetrates downward from the upper surface 240 of the second mirror layer 23, passes through the second mirror layer 23 and the active region 22, and finally reaches the first mirror layer 21 by a bottom portion of the first isolation trench 31.

Figure 5:
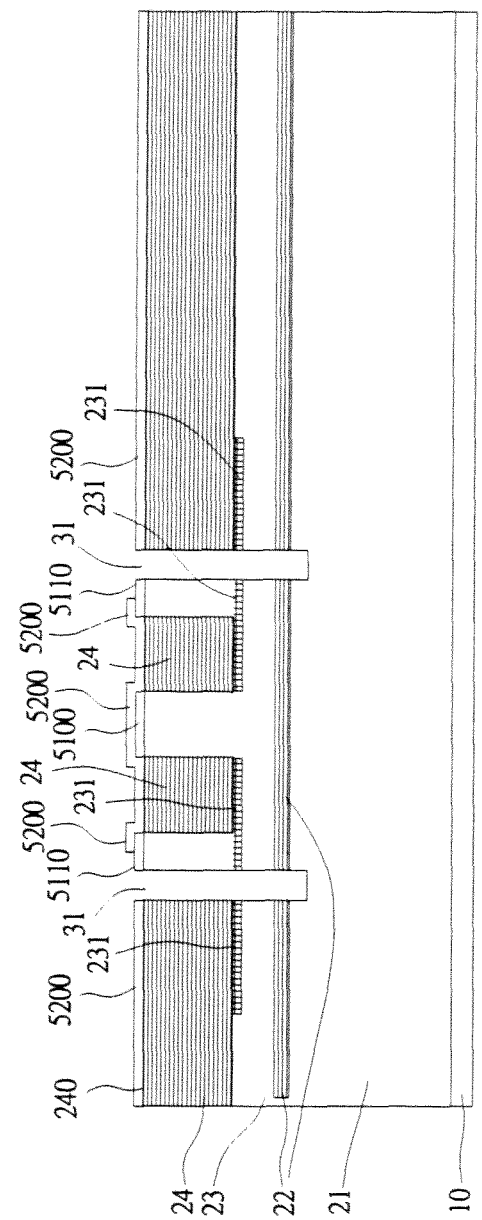
FIG. 5 is a schematic view of a fourth stage of the preferred method for manufacturing the VCSEL structure in accordance with the present invention.

Then, as shown in FIG. 5, a schematic view of a fourth stage of the preferred method for manufacturing the VCSEL structure in accordance with the present invention is schematically illustrated. An oxidation process is performed to form an oxide layer 231 extending horizontally in the second mirror layer 23 and passing through the first isolation trench 31, and the oxide layer 231 is close to, preferably overlapping partly, the ion-implanted region 24. Also, the oxide layer 231 is located in the active region 22. In comparison with the prior art that a second isolation trench 32 is needed for performing the oxidation process of the oxide layer 231 due to the absence of the first isolation trench 31, the oxidation process of the oxide layer 231 in this present invention is carried out through the first isolation trench 31, which is comparatively close in distance to the output window 300. Thus, the necessary distance for oxidation is much shorter, and time for the oxidation process is significantly reduced. Further, possible street concentration problem upon the oxide layer 2 caused by long-distance oxidation can be substantially lessened.

Figure 6:
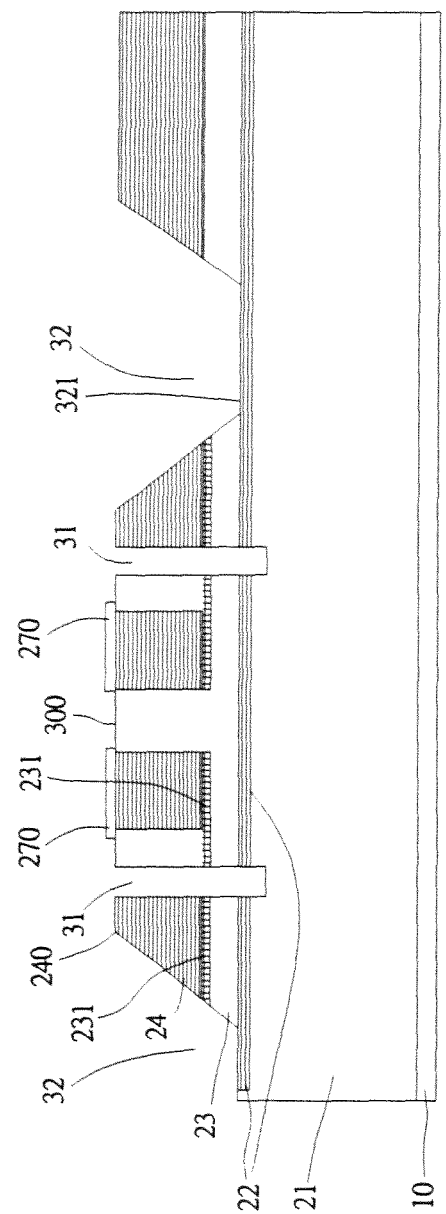
FIG. 6 is a schematic view of a fifth stage of the preferred method for manufacturing the VCSEL structure in accordance with the present invention.

Then, as shown in FIG. 6, a schematic view of a fifth stage of the preferred method for manufacturing the VCSEL structure in accordance with the present invention is schematically illustrated. A second etching process is performed to form a second isolation trench 32 on the second mirror layer 23, in which the second isolation trench 32 penetrates downward from the upper surface 240 of the second mirror layer 23, passes at least through the second mirror layer 23 and the oxide layer 231, and finally has a bottom portion 321 of the second isolation trench 32 to be located in the active region 22 or at the first mirror layer 21. In addition, a metal coating process is performed to form a contact pad in a predetermined area on the upper surface 240 of the second mirror layer 23, where the contact pad would become a portion of the first contact layer 270 lately in the manufacturing process.

Figure 7:
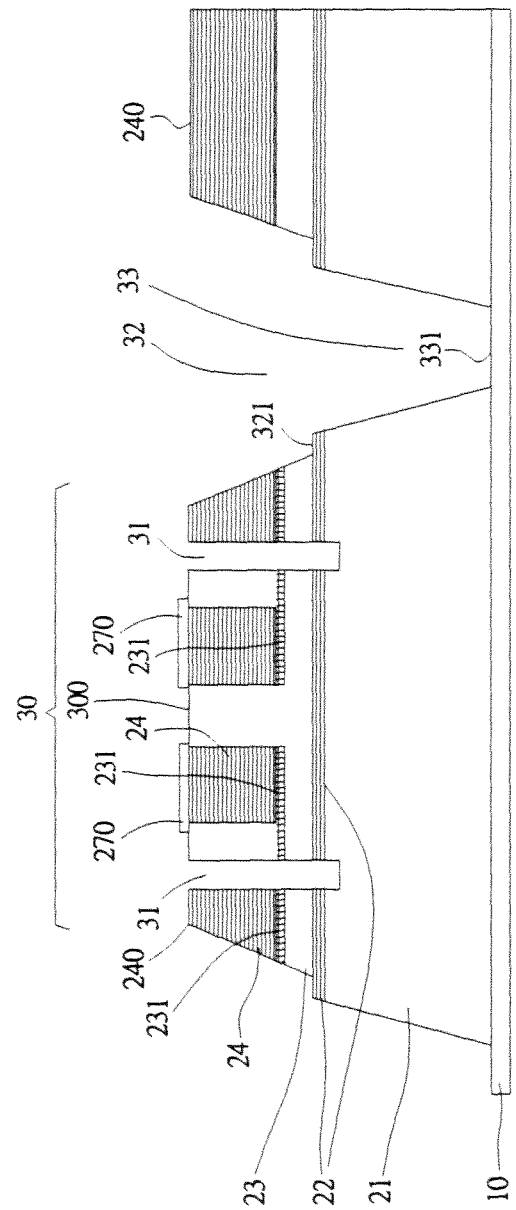
FIG. 7 is a schematic view of a six stage of the preferred method for manufacturing the VCSEL structure in accordance with the present invention.

Then, as shown in FIG. 7, a schematic view of a sixth stage of the preferred method for manufacturing the VCSEL structure in accordance with the present invention is schematically illustrated. A third etching process is performed so as to form a concave third isolation trench 33 at the bottom portion 321 of the second isolation trench 32, where the third isolation trench 33 penetrates downward at least through the first mirror layer 21 (or through the active region 22 and the first mirror layer 21), and finally has a bottom portion 331 of the third isolation trench 33 to be located at the substrate 10.

Thereafter, the first isolation trench 31 is filled with a dielectric material 26 so as thereby to reduce the overall capacitance of the VCSEL structure. In addition, a power output layer 274, an isolating layer 25 and a metal layer 27 (including the first contact layer 270 and the second contact layer 271, 272, 273) are respectively formed in corresponding relevant areas on the laser-chip base material. Thereupon, the VCSEL structure of the present invention as shown in FIG. 1 can be produced.

In this embodiment, as shown in FIG. 1, the second isolation trench 32 and the third isolation trench 33 can be used to define a mesa 30 on the laser-chip base material, by having both the second isolation trench 32 and the third isolation trench 33 to circle at least a portion of the periphery of the mesa 300. The mesa 300, located on the substrate 10, is consisted of at least a portion of the first mirror layer 21, the active region 22, the second mirror layer 23 and the oxide layer 231. In a central area on a top surface of the mesa 300, an output window 300 is located. The first isolation trench 31, located in the mesa 30, circles at least a portion of the periphery of the output window 300, and is spaced from the second isolation trench 32 by a gap. The first isolation trench 31 penetrates downward from the top surface of the mesa 30, passes at least through the second mirror layer 23, the oxide layer 231 and the active region 22.

In this embodiment, the power output layer 274, located on the output window 300 on the top surface of the mesa 30, is to control the output light. The ion-implanted region 24 is located in the second mirror layer 23 at a position thereof on the oxide layer 231 with a bottom portion of the ion-implanted region 24 overlapping partly the oxide layer 231. The ion-implanted region 24 in the mesa 30 is located between the output window 300 and the first isolation trench 31 by circling at least a portion of the periphery of the output window 300. In the present invention, the ion-implanted region 24 is to control the optical mode and to confine the current path.

In this embodiment, the first contact layer 270 is located on the top surface of the mesa 30 by contacting the upper surface of the second mirror layer 23, the second contact layer 271, 272, 273 is at least located at the bottom portion 331 of the third isolation trench 33 by at least contacting the substrate 10, and the second contact layer 271, 272, 273 extends upward along respective oblique surfaces of the third isolation trench 33 and the second isolation trench 32 from the bottom portion 331 of the third isolation trench 33 to the upper surface of the second mirror layer 23, so that a top surface of the second contact layer 271, 272, 273 can be largely flush with the first contact layer 270. Thus, the first contact layer 270 and the second contact layer 271, 272, 273 of the present invention are located on the same side of the substrate 10, and almost at the same height to convene the following wire-bonding process. In addition, at least a portion of the first contact layer 270 and the second contact layer 271, 272, 273 is exposed out of the isolating layer 25. The bottom portion 321 of the second isolation trench 32 is formed as a plane so that the second contact layer 271, 272, 273 can be in a horizon-extending state at the bottom portion 321 of the second isolation trench 32. Thereupon, a step-like structure having double mesa-layers can be formed so as to provide a larger lower portion to the mesa, from which the heat-radiating area can be broader and better for reducing the thermal effects. Also, since oblique sidewalls of the two-step concave second and third isolation trenches 32, 33 are less stiff and the bottom portion 321 of the second isolation trench 32 is a plane, thus, while the second contact layer 271, 272, 273 is under plating, sputtering or evaporating for forming the metal layer, possible metal-gap defects can be effectively prevented.

While the present invention has been particularly shown and described with reference to a preferred embodiment, it will be understood by those skilled in the art that various changes in form and detail may be without departing from the spirit and scope of the present invention.

What is claimed is:
1. A VCSEL structure, comprising:
   a substrate;
   a first mirror layer, located on the substrate;
   an active region, located on the first mirror layer;
   a second mirror layer, located on active region;
   an oxide layer, located in the second mirror layer;
   a mesa, located on the substrate, structured by at least a portion of the first mirror layer, the active region, the second mirror layer and the oxide layer, an output window being included in a central area of a top surface of the mesa;
   a first isolation trench, located in the mesa, circling at least a portion of a periphery of the output window, penetrating downward through the second mirror layer, the oxide layer and the active region from the top surface of the mesa;
   a second isolation trench, circling at least another portion of the periphery of the mesa, spaced from the first isolation trench by a gap, penetrating downward at least through the second mirror layer and the oxide layer, having a bottom portion thereof located either in the active region or at the first mirror layer;
   a third isolation trench, circling at least a further portion of the periphery of the mesa, being concave from the bottom portion of the second isolation trench, penetrating downward at least through the first mirror layer, having a bottom portion thereof to be located at the substrate;
   a dielectric material, at least filling the first isolation trench;
   a first contact layer, located on the top surface of the mesa by contacting the second mirror layer; and
   a second contact layer, at least located on the bottom portion of the third isolation trench by contacting at least the substrate.

2. The VCSEL structure of claim 1, wherein:
the VCSEL structure further includes an isolating layer covering at least a portion of an outer surface of the mesa, and at least a portion of the first contact layer and the second contact layer are exposed out of the isolating layer;
the first mirror layer is an n-type distributed Bragg reflector (DBR) layer, while the second mirror layer is a p-type DBR layer;
materials of the first mirror layer and the second mirror layer include AlGaAs with various Al mole percentages, wherein the oxide layer of the second mirror layer contains Al with a relative high mole percentage;
the oxide layer at least extends horizontally from an inner rim of the first isolation trench toward a center of the mesa;
the dielectric material is a polymer material with low dielectric properties; and,
the first contact layer and the second contact layer are both metal layers.

3. The VCSEL structure of claim 1, further including:
an ion-implanted region, located in the second mirror layer by being close in height to or overlapping the oxide layer, and the ion-implanted region inside the mesa is located between the output window and the first isolation trench by circling at least a portion of a periphery of the output window;
wherein the first contact layer contacts an upper surface of the second mirror layer.

4. The VCSEL structure of claim 1, further including a power output layer located on the output window on the top surface of the mesa.

5. The VCSEL structure of claim 1, wherein:
the second contact layer is extended upward to an upper surface of the second mirror layer along respective oblique surfaces of the third isolation trench and the second isolation trench from the bottom portion of the third isolation trench, such that a top surface of the second contact layer is largely flush with the first contact layer; and,
a plane is formed at the bottom portion of the second isolation trench so as to have the second contact layer to be in a horizon-extending state at the bottom portion of the second isolation trench.

6. A method for manufacturing VCSEL structures, comprising the steps of:
performing a semiconductor process on a laser-chip base material so as to have the laser-chip base material to include, in an upward order, a substrate, a first mirror layer on the substrate, an active region on the first mirror layer, and a second mirror layer on the active region;
performing a first mask manufacturing process through a first mask to form a first mask layer with a first predetermined pattern on an upper surface of the second mirror layer, wherein the first predetermined pattern is respective to a pattern of the first mask;
performing an ion-implantation process to form an ion-implanted region in an area of the second mirror layer uncovered by the first photoresist layer, wherein a bottom portion of the ion-implanted region is spaced from the active region by a predetermined height;
with the first mask layer unremoved, performing a second mask manufacturing process through a second mask to form a second mask layer with a second predetermined pattern on the upper surface of the second mirror layer and the first mask layer, wherein the second predetermined pattern is respective to a pattern of the second mask;
performing a first etching process to form a first isolation trench by etching an area of the second mirror layer, the active region and the first mirror layer covered by the second mask layer, wherein the first isolation trench penetrates downward through the second mirror layer and the active region from the upper surface of the second mirror layer so as to have a bottom portion of the first isolation trench located at the first mirror layer;
performing an oxidation process through the first isolation trench to form an oxide layer extending horizontally in the second mirror layer, wherein the oxide layer is close in height to or overlapping the bottom portion of the ion-implanted region;
performing a second etching process to form a second isolation trench on the second mirror layer, wherein the second isolation trench penetrates downward at least through the second mirror layer and the oxide layer from the upper surface of the second mirror layer so as to locate a bottom portion of the second isolation trench in the active region or at the first mirror layer; and,
performing a metal coating process to form a contact pad in a predetermined area on the upper surface of the second mirror layer;
performing a third etching process to form a concave third isolation trench at the bottom portion of the second isolation trench, wherein the third isolation trench penetrates downward at least through the first mirror layer so as to locate a bottom portion of the third isolation trench at the substrate; and
filling a dielectric material into the first isolation trench, and forming an isolating layer, a first contact layer and a second contact layer respectively in specific areas on the laser-chip base material;
wherein a mesa is defined on the laser-chip base material by the second isolation trench and the third isolation trench, each of the second isolation trench and the third isolation trench circles at least a corresponding portion of a periphery of the mesa, the mesa on the substrate consists of at least a portion of the first mirror layer, the active region, the second mirror layer and the oxide layer, an output window is formed in a central area on a top surface of the mesa, the first isolation trench located in the mesa circles at least a portion of a periphery of the output window and is spaced from the second isolation trench by a gap, and the first isolation trench penetrates downward at least through the second mirror layer, the oxide layer and the active region from the top surface of the mesa;
wherein the first contact layer located on the top surface of the mesa contacts the second mirror layer, the second contact layer at least located at the bottom portion of the third isolation trench at least contacts the substrate, the second contact layer is extended upward to the upper surface of the second mirror layer along respective oblique surfaces of the third isolation trench and the second isolation trench from the bottom portion of the third isolation trench such that a top surface of the second contact layer is largely flush with the first contact layer, and a portion of the first contact layer and the second contact layer is at least exposed out of the isolating layer.

7. The method of claim 6, wherein:

the first mirror layer is an n-type distributed Bragg reflector (DBR) layer, while the second mirror layer is a p-type DBR layer;

materials of the first mirror layer and the second mirror layer include AlGaAs with various Al mole percentages, wherein the oxide layer of the second mirror layer contains Al with a relative high mole percentage;

the oxide layer at least extends horizontally from an inner rim of the first isolation trench toward a center of the mesa;

the dielectric material is a polymer material with low dielectric properties; and, the first contact layer and the second contact layer are both metal layers.

8. The method of claim 6, wherein the ion-implanted region is located in the second mirror layer, and the ion-implanted region inside the mesa is located between the output window and the first isolation trench by circling at least a portion of a periphery of the output window.

9. The method of claim 6, further including a step of forming a power output layer on the output window on the top surface of the mesa.

10. The method of claim 6, wherein a plane is formed at the bottom portion of the second isolation trench so as to have the second contact layer to be in a horizon-extending state at the bottom portion of the second isolation trench.

* * * * *